(12) United States Patent
Deguchi

(10) Patent No.: US 12,101,036 B2
(45) Date of Patent: Sep. 24, 2024

(54) ELECTRIC POWER CONVERTER

(71) Applicant: DENSO CORPORATION, Kariya (JP)

(72) Inventor: Masataka Deguchi, Toyota (JP)

(73) Assignee: DENSO CORPORATION, Kariya (JP)

(*) Notice: Subject to any disclaimer, the term of this patent is extended or adjusted under 35 U.S.C. 154(b) by 242 days.

(21) Appl. No.: 17/872,507

(22) Filed: Jul. 25, 2022

(65) Prior Publication Data

US 2022/0360189 A1 Nov. 10, 2022

Related U.S. Application Data

(63) Continuation of application No. PCT/JP2020/007374, filed on Feb. 25, 2020.

(30) Foreign Application Priority Data

Jan. 31, 2020 (JP) .................. 2020-015555

(51) Int. Cl.
*H05K 1/02* (2006.01)
*B60L 50/64* (2019.01)
(Continued)

(52) U.S. Cl.
CPC .......... *H02M 7/003* (2013.01); *H02M 7/5387* (2013.01); *H05K 7/20927* (2013.01)

(58) Field of Classification Search
CPC ............ H05K 1/02; H05K 1/182; H05K 3/20; H05K 3/203; H05K 7/20; H05K 7/209;
(Continued)

(56) References Cited

U.S. PATENT DOCUMENTS

2011/0188279 A1* 8/2011 Aiba ............... H02M 1/00
363/141
2013/0270024 A1* 10/2013 Matsuda ............. B60L 50/66
180/220

(Continued)

FOREIGN PATENT DOCUMENTS

JP 2009100514 A 5/2009
JP 2018042424 A 3/2018
(Continued)

OTHER PUBLICATIONS

Jun. 16, 2020 International Search Report issued in International Patent Application No. PCT/JP2020/007374.

*Primary Examiner* — Xiaoliang Chen
(74) *Attorney, Agent, or Firm* — Oliff PLC

(57) ABSTRACT

The disclosure herein relates to an electric power converter in which a power module accommodating a switching element for electric power conversion is in contact with a cooler, and provides a structure capable of effectively cooling the power module. An electric power converter includes coolers in contact with a power module. A stacked body of the power module and the coolers is accommodated in a case. The surface of the first cooler opposite to the power module is in contact with the case, and an output bus bar is connected to a midpoint terminal and is in contact with the case. The first cooler directly cools the power module by one surface, and absorbs heat from the power module transferred via the midpoint terminal and the output bus bar by another surface.

8 Claims, 6 Drawing Sheets

(51) Int. Cl.
*H02K 11/20* (2016.01)
*H02M 1/00* (2007.01)
*H02M 7/00* (2006.01)
*H02M 7/5387* (2007.01)
*H05K 3/20* (2006.01)
*H05K 7/20* (2006.01)

(58) Field of Classification Search
CPC ............. H05K 7/1432; H05K 7/14329; H05K 7/20854; H05K 7/20872; H05K 7/20927; B60L 15/007; B60L 50/64; B60L 50/66; H01F 27/2804; H02M 1/00
USPC ............. 361/775, 688, 704, 707; 312/223.1; 310/54; 363/141
See application file for complete search history.

(56) References Cited

U.S. PATENT DOCUMENTS

| | | | |
|---|---|---|---|
| 2015/0173244 A1* | 6/2015 | Nakanishi | H05K 7/14322 312/223.1 |
| 2016/0126808 A1* | 5/2016 | Nagao | H02K 11/0094 310/54 |
| 2019/0335607 A1* | 10/2019 | Song | H05K 7/209 |
| 2019/0335608 A1* | 10/2019 | Song | H05K 7/20854 |
| 2020/0352059 A1* | 11/2020 | Kim | H05K 7/20927 |

FOREIGN PATENT DOCUMENTS

| | | |
|---|---|---|
| JP | 2018110469 A | 7/2018 |
| JP | 2019165170 A | 9/2019 |

* cited by examiner

ELECTRIC POWER CONVERTER

CROSS-REFERENCE TO RELATED APPLICATION

This application is the U.S. bypass application of International Application No. PCT/JP2020/007374 filed on Feb. 25, 2020 which designated the U.S. and claims priority to Japanese Patent Application No. 2020-015555 filed on Jan. 31, 2020, the contents of both of which are incorporated herein by reference.

TECHNICAL FIELD

The technique disclosed herein relates to an electric power converter that includes a power module accommodating a switching element for electric power conversion and a cooler cooling the power module.

BACKGROUND

There are known electric power converters that include a plurality of power modules accommodating switching elements for electric power conversion and a cooler cooling the power modules. For example, JP 2018-042424 A (PTL 1), JP 2009-100514 A (PTL 2), and JP 2019-165170 A (PTL 3) disclose such electric power converters. In the electric power converter of PTL 1, a plurality of coolers and a plurality of power modules are alternately stacked one by one. In the electric power converter of PTL 2, power modules are in contact with the corresponding surfaces of one rectangular solid cooler. In the electric power converter of PTL 3, a plurality of power modules is sandwiched between a pair of coolers. In the electric power converter of PTL 3, a metal case is in contact with the surface of one cooler opposite to the power modules, and a reactor is accommodated in the metal case. That is, the coolers cool the power modules and the reactor.

SUMMARY

In a power module, a terminal is connected to a switching element in a package of the power module and extends to the outside of the package. The terminal is made from a material having high thermal conductivity such as copper. The heat from the switching element is transferred through the terminal and discharged to the outside of the package. In an electric power converter disclosed herein, one surface (first surface) of one cooler (first cooler) is in contact with a power module. Another surface (second surface) of the first cooler is in contact with a case. A first terminal of the power module (first terminal connected to the switching element) or a first bus bar connected to the first terminal is in contact with the case.

In the electric power converter disclosed herein, the first cooler directly cools the package of the power module by the first surface. The second surface (different from the first surface) of the first cooler cools the first terminal or the first bus bar via the case. A part of the heat from the power module is absorbed by the first cooler through the first surface. Another part of the heat from the power module is absorbed by the first cooler through the first terminal or the first bus bar and the second surface. The electric power converter disclosed herein can effectively cool the same power module by a plurality of surfaces of the cooler.

BRIEF DESCRIPTION OF THE DRAWINGS

The above features of the present disclosure will be made clearer by the following detailed description, given referring to the appended drawings. In the accompanying drawings.

DETAILED DESCRIPTION OF THE PREFERRED EMBODIMENTS

Figure 1:
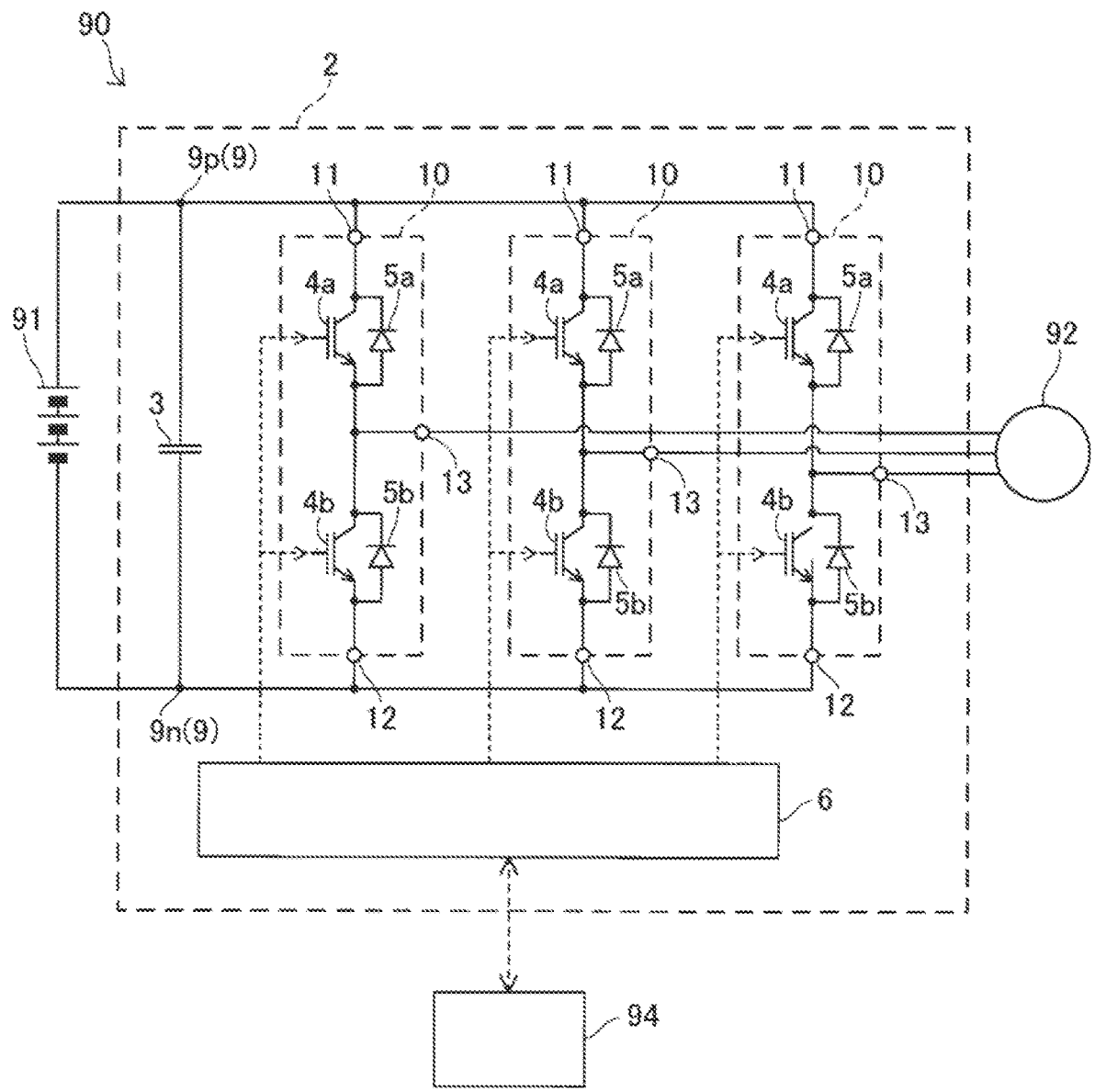
FIG. 1 is a circuit diagram of an electric power converter in a first embodiment.

In the electric power converters disclosed in PTLs 1 and 2, a first power module is cooled by one surface of the cooler and a second power module is cooled by another surface of the cooler. In the electric power converter disclosed in PTL 3, the power modules are cooled by one surface of the cooler and the reactor is cooled by the opposite surface of the cooler. That is, both power converters of PTLs 1 and 2 cool different power modules (that is, switching elements) on one surface of the cooler and another surface of the cooler, respectively.

Since a power module generates a large amount of heat, the same power module can be desirably cooled by a plurality of surfaces of one cooler. Provided herein is a structure in which the same power module can be effectively cooled by a plurality of surfaces of a cooler.

In a power module, a terminal is connected to a switching element in a package of the power module and extends to the outside of the package. The terminal is made from a material having high thermal conductivity such as copper. The heat from the switching element is transferred through the terminal and discharged to the outside of the package. In an electric power converter disclosed herein, one surface (first surface) of one cooler (first cooler) is in contact with a power module. Another surface (second surface) of the first cooler is in contact with a case. A first terminal of the power module (first terminal connected to the switching element) or a first bus bar connected to the first terminal is in contact with the case.

In the electric power converter disclosed herein, the first cooler directly cools the package of the power module by the first surface. The second surface (different from the first surface) of the first cooler cools the first terminal or the first bus bar via the case. A part of the heat from the power module is absorbed by the first cooler through the first surface. Another part of the heat from the power module is absorbed by the first cooler through the first terminal or the first bus bar and the second surface. The electric power converter disclosed herein can effectively cool the same power module by a plurality of surfaces of the cooler.

A plurality of power module may be in contact with one cooler (first cooler) or one or more power modules may be sandwiched between a pair of coolers. The electric power converter disclosed herein includes a second cooler and a capacitor accommodated in the case, and the power module is sandwiched between the first cooler and the second cooler. The power module includes the first terminal, a second terminal, and a third terminal. A second bus bar is connected to the second terminal and a third bus bar is connected to the third terminal are each connected to the capacitor. A first surface of the second cooler is in contact with the power module, and the second terminal or the second bus bar is in contact with a second surface of the second cooler different from the first surface.

Herein, a state where a power module and a cooler (or a bus bar and a case) are thermally in contact with each other with a highly thermal conductive insulating layer in between will be expressed as simply "a power module and a cooler are in contact with each other". The thermal conductivity of the case is desirably high as well as the thermal conductivity of the insulating layer interposed between the power module and the cooler (or between the bus bar and the case). The details and further improvements of the technique disclosed herein will be described below.

First Embodiment

An electric power converter 2 of a first embodiment will be described with reference to the drawings. First, a circuit configuration of the electric power converter 2 will be described. FIG. 1 is a circuit diagram of the electric power converter 2. The electric power converter 2 is mounted in an electric automobile 90. The electric power converter 2 is an inverter and converts direct-current power from a battery 91 into alternating-current power for driving a driving motor 92.

The electric power converter 2 includes a capacitor 3 connected between a positive pole 9p and a negative pole 9n of a direct-current end 9, six switching elements 4 (4a and 4b) for electric power conversion, and six diodes 5 (5a and 5b). The six switching elements 4 are connected in series of two each. The switching elements 4 on the positive pole 9p side will also be called switching elements 4a, and the switching elements 4 on the negative pole 9n side will also be called switching elements 4b.

Three series connection circuits (series connection circuits of the two switching elements 4a and 4b) are connected in parallel between the positive pole 9p and the negative pole 9n of the direct-current end 9. The diodes 5 (5a and 5b) are connected in reverse parallel to the corresponding switching elements 4. The diodes 5 connected in parallel to the switching elements 4a will also be called diodes 5a, and the diodes 5 connected in parallel to the switching elements 4b will also be called diodes 5b. Alternating-current power is output from a midpoint between each series connection circuit of the two switching elements 4a and 4b.

The capacitor 3 is connected to the positive pole 9p and the negative pole 9n of the direct-current end 9. The capacitor 3 is connected in parallel to the three series connection circuits. The capacitor 3 suppresses pulsation of electric current flowing into the three series connection circuits. The capacitor 3 may also be called smoothing capacitor.

The six switching elements 4 are controlled by a motor controller 6. Arrow broken lines in FIG. 1 indicate signal lines that are connected from the motor controller 6 to the gates of the switching elements 4.

The motor controller 6, upon receipt of a target output of the motor 92 from a higher-order controller 94, controls the six switching elements 4 so as to achieve the target output. When the switching elements 4a on the positive pole side and the switching elements 4b on the negative pole side are alternately turned on and off, alternating-current power is output from the midpoints in the series connection circuits.

The two each switching elements 4a and 4b connected in series are accommodated in a corresponding power module 10. Each broken-line rectangle shown with reference numeral 10 indicates a power module. The diodes 5a and 5b connected in parallel to the corresponding switching elements 4a and 4b are also accommodated in the power module 10. The electric power converter 2 includes three power modules 10. A hardware structure of each power module 10 will be described later.

Each of the power modules 10 includes three power terminals (positive terminal 11, negative terminal 12, and midpoint terminal 13). The positive terminal 11, the negative terminal 12, and the midpoint terminal 13 are connected to the high-potential side, low-potential side, and midpoint of the series connection circuit of the two switching elements 4a and 4b, respectively.

Figure 2:
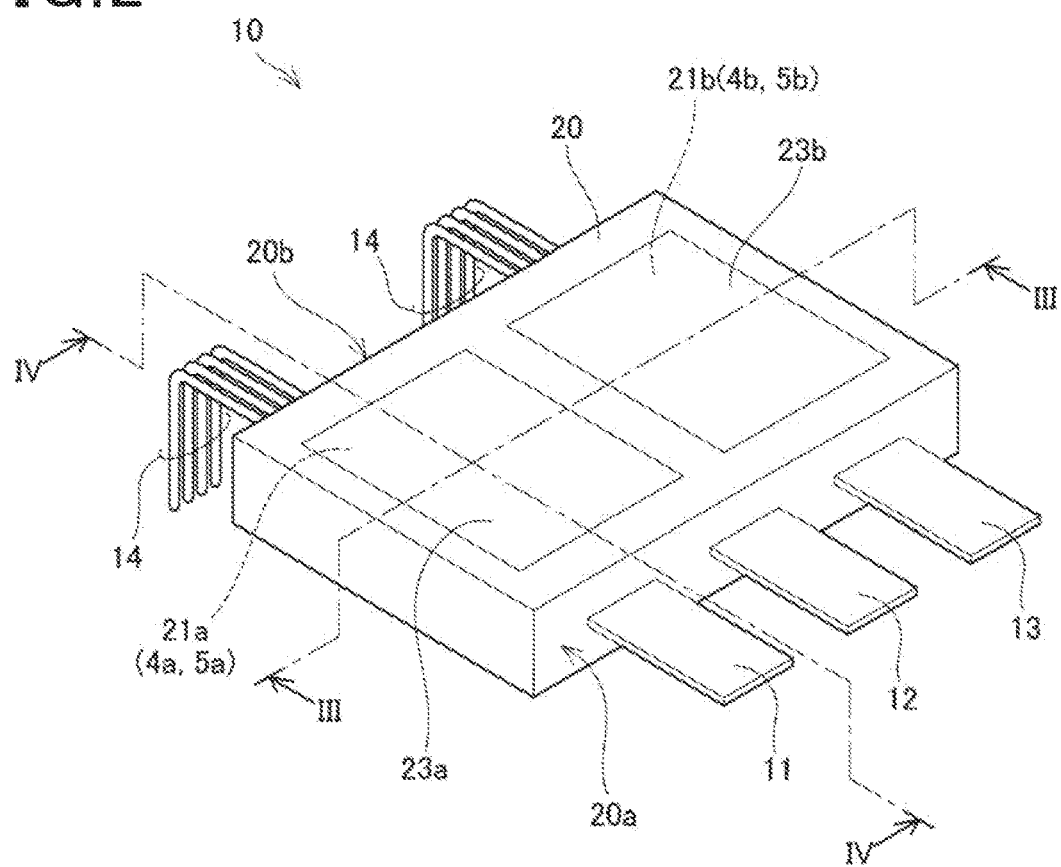
FIG. 2 is a perspective view of a power module.
Figure 3:
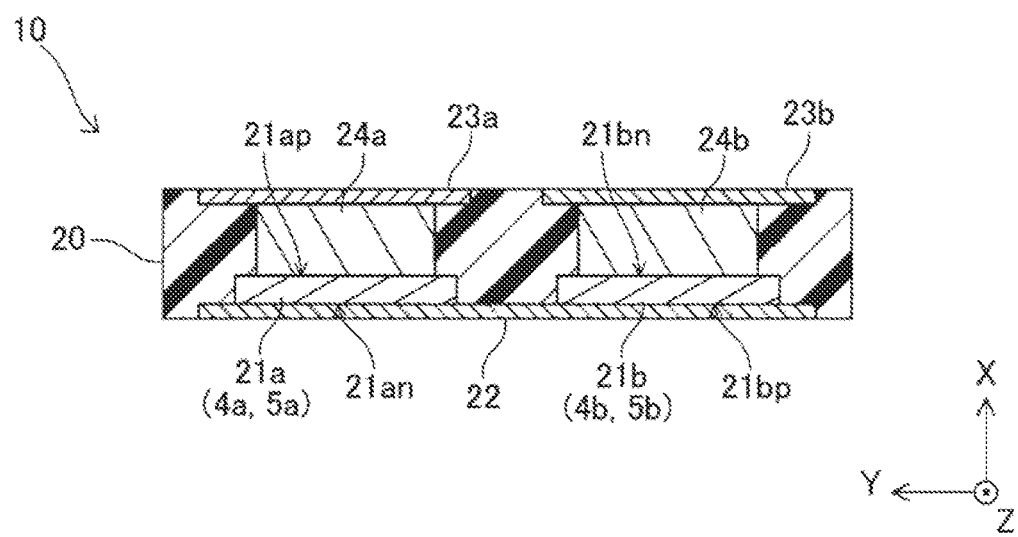
FIG. 3 is a cross-sectional view of the power module taken along line III-III of FIG. 2.
Figure 4:
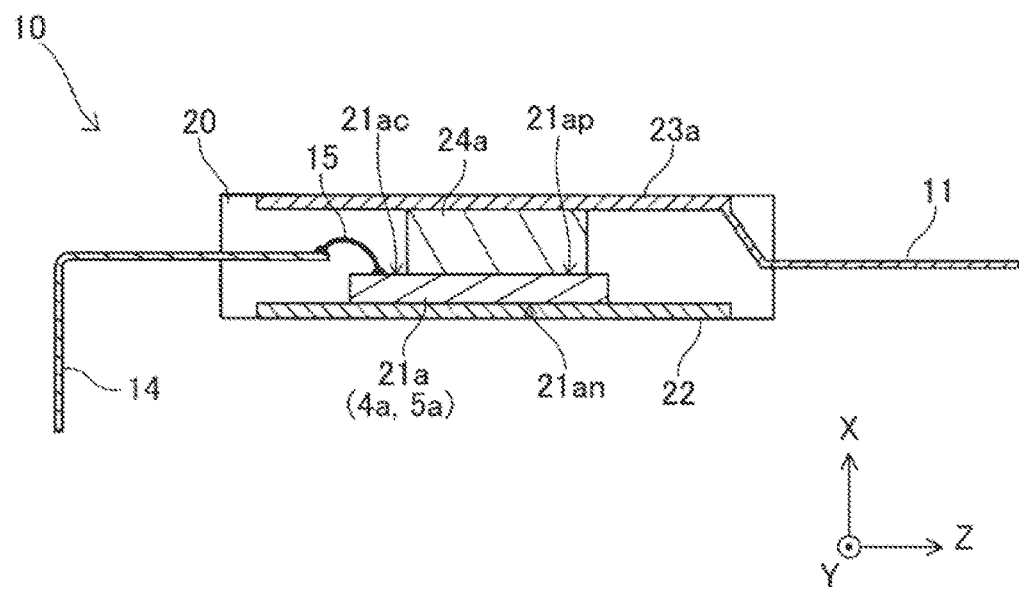
FIG. 4 is a cross-sectional view of the power module taken along line IV-IV of FIG. 2.

FIG. 2 is a perspective view of one power module 10. FIG. 3 is a cross-sectional view taken along line III-III of FIG. 2. FIG. 4 is a cross-sectional view taken along line IV-IV of FIG. 2. The main body of the power module 10 constitutes a package 20 of resin, and two semiconductor chips 21a and 21b are embedded in the package 20. For the sake of understanding, hatching for indicating the cross section of the resin package 20 is omitted in FIG. 4.

The parallel circuit of the switching element 4a and the diode 5a illustrated in FIG. 1 is packaged on the semiconductor chip 21a, and the parallel circuit of the switching element 4b and the diode 5b illustrated in FIG. 1 is packaged on the semiconductor chip 21b.

An internal structure of the package 20 will be described with reference to FIGS. 3 and 4. The semiconductor chips 21a and 21b are flat plates and have electrodes exposed on their both wide surfaces. A positive pole 21ap of the semiconductor chip 21a (a positive pole of the switching elements 4a) is joined to a spacer 24a, and a metal plate 23a is joined to the opposite side of the spacer 24a. A negative pole 21an of the semiconductor chip 21a (a negative pole of the switching elements 4a) is joined to a metal plate 22, and a positive pole 21bp of the semiconductor chip 21b (a positive pole of the switching element 4b) is joined to the metal plate 22. That is, the metal plate 22 connects the two switching elements 4a and 4b in series.

A negative pole 21bn of the semiconductor chip 21b (a negative pole of the switching elements 4b) is joined to a spacer 24b, and a metal plate 23b is joined to the opposite side of the spacer 24b. First surfaces of the metal plates 22, 23a, and 23b are exposed to the outside of the package 20 to dissipate heat from the semiconductor chips 21a and 21b.

The metal plate 23a corresponds to the high-potential side of the series connection circuit of the switching elements 4a and 4b, and the metal plate 23b corresponds to the low-potential side of the series connection circuit. The metal plate 22 corresponds to the midpoint in the series connection circuit. As illustrated in FIG. 4, the positive terminal 11 is connected to an edge of the metal plate 23a. The high-potential side of the series connection of the two switching elements 4a and 4b is electrically connected to the positive terminal 11 via the spacer 24a and the metal plate 23a. Although not illustrated, the negative terminal 12 is connected to the metal plate 23b corresponding to the low-potential side of the series connection circuit, and the midpoint terminal 13 is connected to the metal plate 22 corresponding to the midpoint in the series connection circuit. The series connection circuit of the switching elements 4a and 4b in the package 20 is connected to the positive terminal 11, the negative terminal 12, and the midpoint terminal 13 via the metal plates 23a, 23b, and 22, and these terminals extend from the inside to outside of the package 20.

A control electrode 21ac is also exposed on one surface of the semiconductor chip 21a. There is a plurality of control electrodes 21ac, and these electrodes are connected to the gate electrode and sense emitter of the switching element 4a. A plurality of control terminals 14 extends from the package 20. The plurality of control terminals 14 is connected to the plurality of corresponding control electrodes 21ac by bonding wires 15 within the package 20. The same thing applies to the semiconductor chip 21b, and control terminals 14 are connected to control electrodes of the semiconductor chip 21b.

Returning to FIG. 2, a structure of the power module 10 will be described. The package 20 is flat, and the metal plates 23a and 23b are exposed on the wide surface of the package 20 oriented in a +X direction in the coordinate system illustrated in FIG. 2. The metal plate 22 is exposed on the opposite wide surface of the package 20. The three power terminals (the positive terminal 11, the negative terminal 12, and the midpoint terminal 13) are provided on a narrow surface 20a of the package 20 oriented in a +Z direction illustrated in FIG. 2. The control terminals 14 are provided on an opposite narrow surface 20b oriented in a −Z direction. As described later, the control terminals 14 are connected to the motor controller 6. The motor controller 6 sends drive signals to the switching elements 4a and 4b via the control terminals 14.

As illustrated in FIG. 1, the capacitor 3 is connected in parallel to the three power modules 10. The positive terminals 11 of the three power modules 10 are connected to one electrode of the capacitor 3, and the negative terminals 12 are connected to the other electrode of the capacitor 3. The three power modules 10 and the capacitor 3 are connected via a positive bus bar 41 and a negative bus bar 43.

Figure 5:
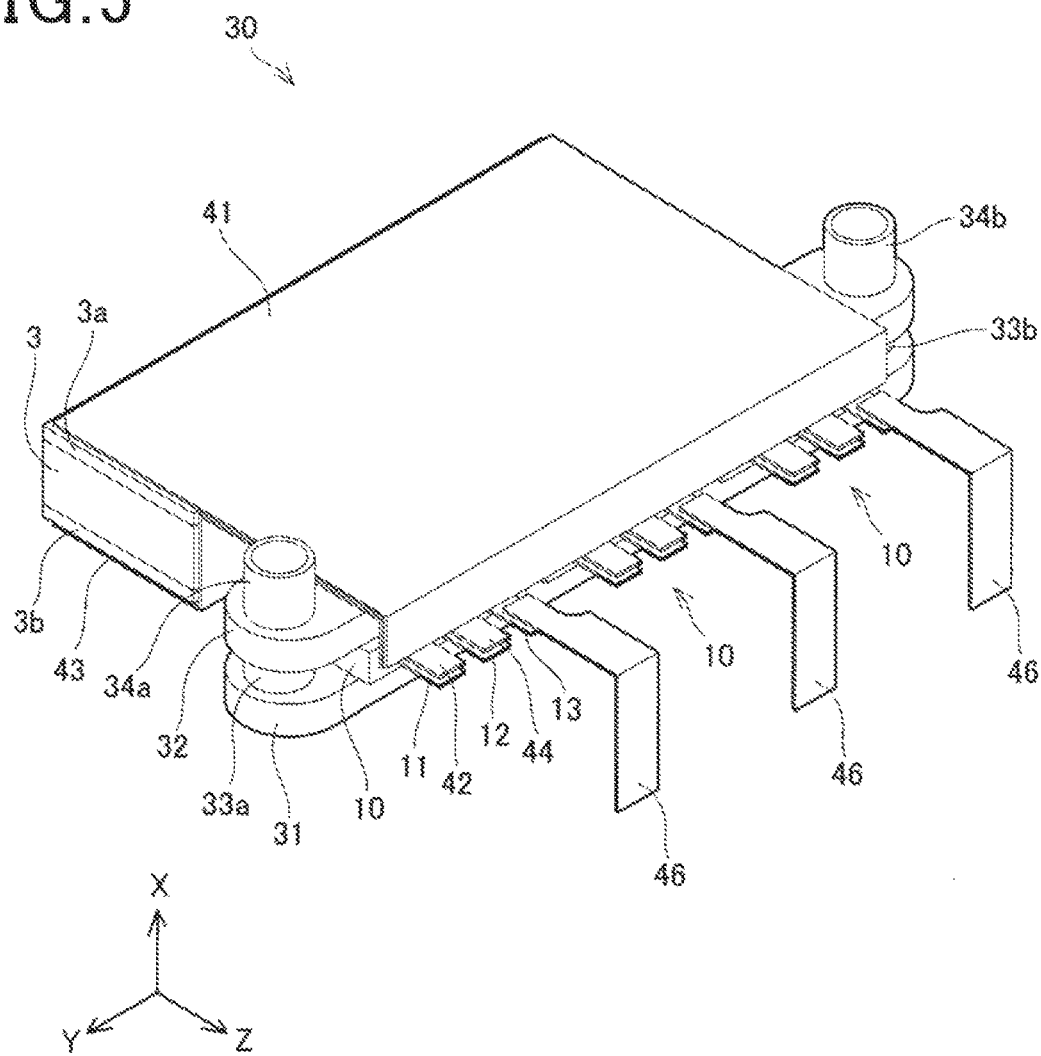
FIG. 5 is a perspective view of a power module assembly.
Figure 6:
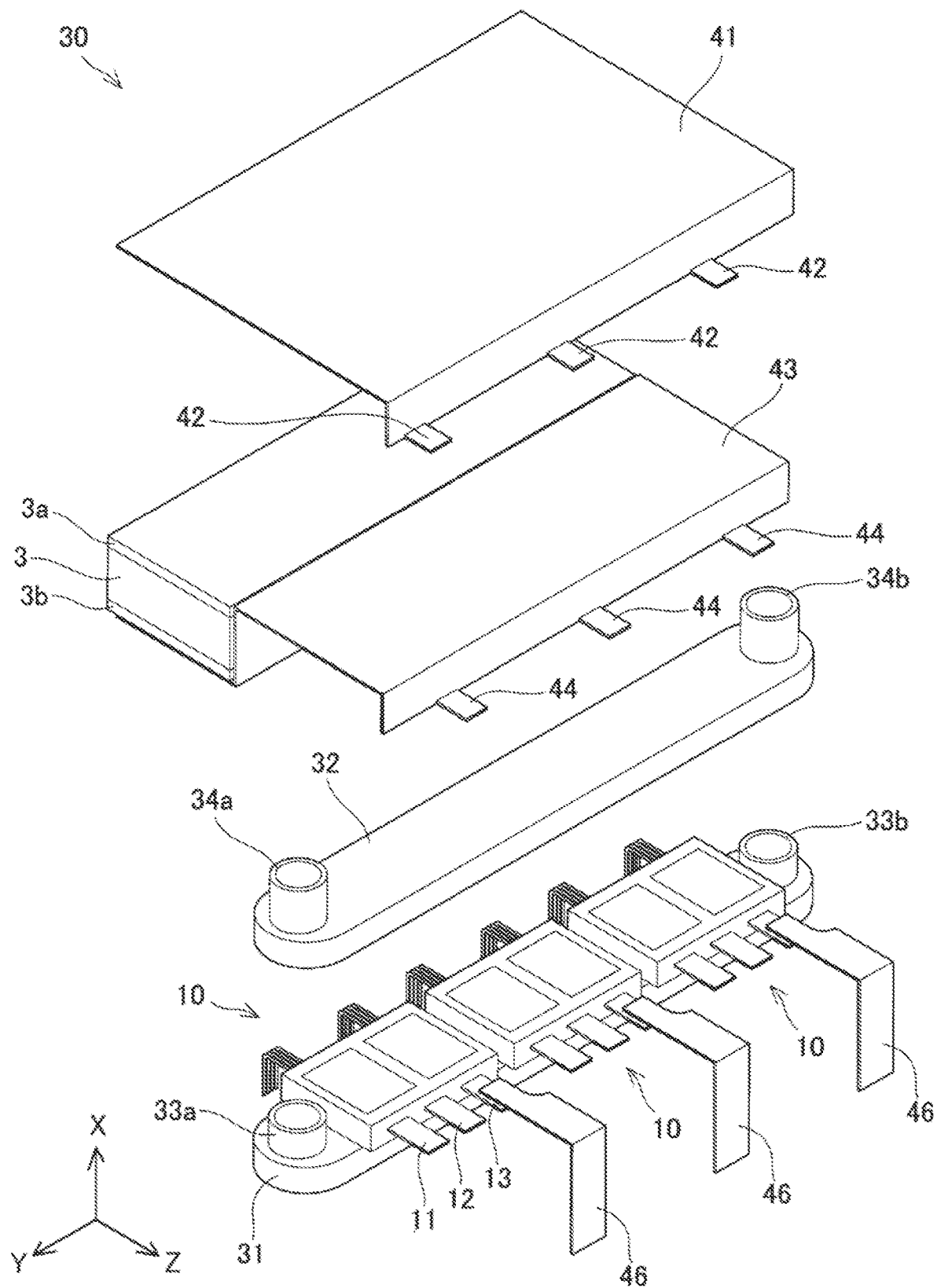
FIG. 6 is an exploded view of the power module assembly.

The power modules 10 (the switching elements 4a and 4b) generate a large amount of heat, and thus the electric power converter 2 includes a pair of coolers 31 and 32 that cools the power modules 10. FIG. 5 is a perspective view of an assembly 30 of the power modules 10, the coolers 31 and 32, and the capacitor 3. FIG. 6 is an exploded view of the assembly 30. In the following description, the cooler 31 will also be called first cooler 31, and the cooler 32 will also be called second cooler 32. In FIGS. 5 and 6, the power terminals of only the front power module 10 are shown with reference numerals 11, 12, and 13, and the power terminals of the remaining power modules 10 are shown without reference numerals.

The three power modules 10 are sandwiched between the pair of coolers 31 and 32. The three power modules 10 are arranged in a line and are sandwiched between the pair of coolers 31 and 32 such that each of the power modules 10 is in contact with the first cooler 31 and the second cooler 32. The metal plates 22, 23a, and 23b are exposed on both wide surfaces of the power modules 10, and each of the metal plates 22, 23a, and 23b is in contact with the coolers. Each of the three power modules 10 is cooled by the coolers 31 and 32 through the both wide surfaces.

The pair of coolers 31 and 32 is coupled by coupling pipes 33a and 33b. The coupling pipes 33a and 33b couple the coolers 31 and 32 by their both ends as seen in an arrangement direction of the power modules 10 (Y direction in the coordinate system illustrated in FIG. 2). The coolers 31 and 32 are hollow and the coupling pipes 33a and 33b cause the cavities of the coolers 31 and 32 to communicate with each other. The second cooler 32 has refrigerant intake and exhaust pipes 34a and 34b at both ends. The refrigerant intake and exhaust pipes 34a and 34b are connected to a refrigerant circulation device not illustrated. A liquid refrigerant supplied from the refrigerant circulation device is distributed to the coolers 31 and 32 through the refrigerant intake and exhaust pipe 34a and the coupling pipe 33a. The refrigerant absorbs heat from the power modules 10 while passing through the coolers 31 and 32. The refrigerant at an increased temperature due to heat absorption returns to the refrigerant circulation device through the coupling pipe 33b the refrigerant intake and exhaust pipe 34b.

The capacitor 3 is arranged next to a stacked body of the coolers 31, 32 and the power modules 10. The positive terminals 11 (the negative terminals 12) of the three power modules 10 are connected to the positive pole 3a (the negative pole 3b) of the capacitor 3 via the positive bus bar 41 (the negative bus bars 43). The positive bus bar 41 has three tubs 42 at an edge. The three tubs 42 are joined to the corresponding positive terminals 11 of the three power modules 10. The negative bus bar 43 also has three tubs 44. The tubs 44 are joined to the corresponding negative terminals 12.

Three output bus bars 46 are joined to the corresponding midpoint terminals 13 of the three power modules 10. As described above, the three power modules 10 constitute an inverter. The midpoint terminals 13 of the three power modules 10 output alternating-current power. The output bus bars 46 correspond to an alternating-current output end of the electric power converter 2.

Figure 7:
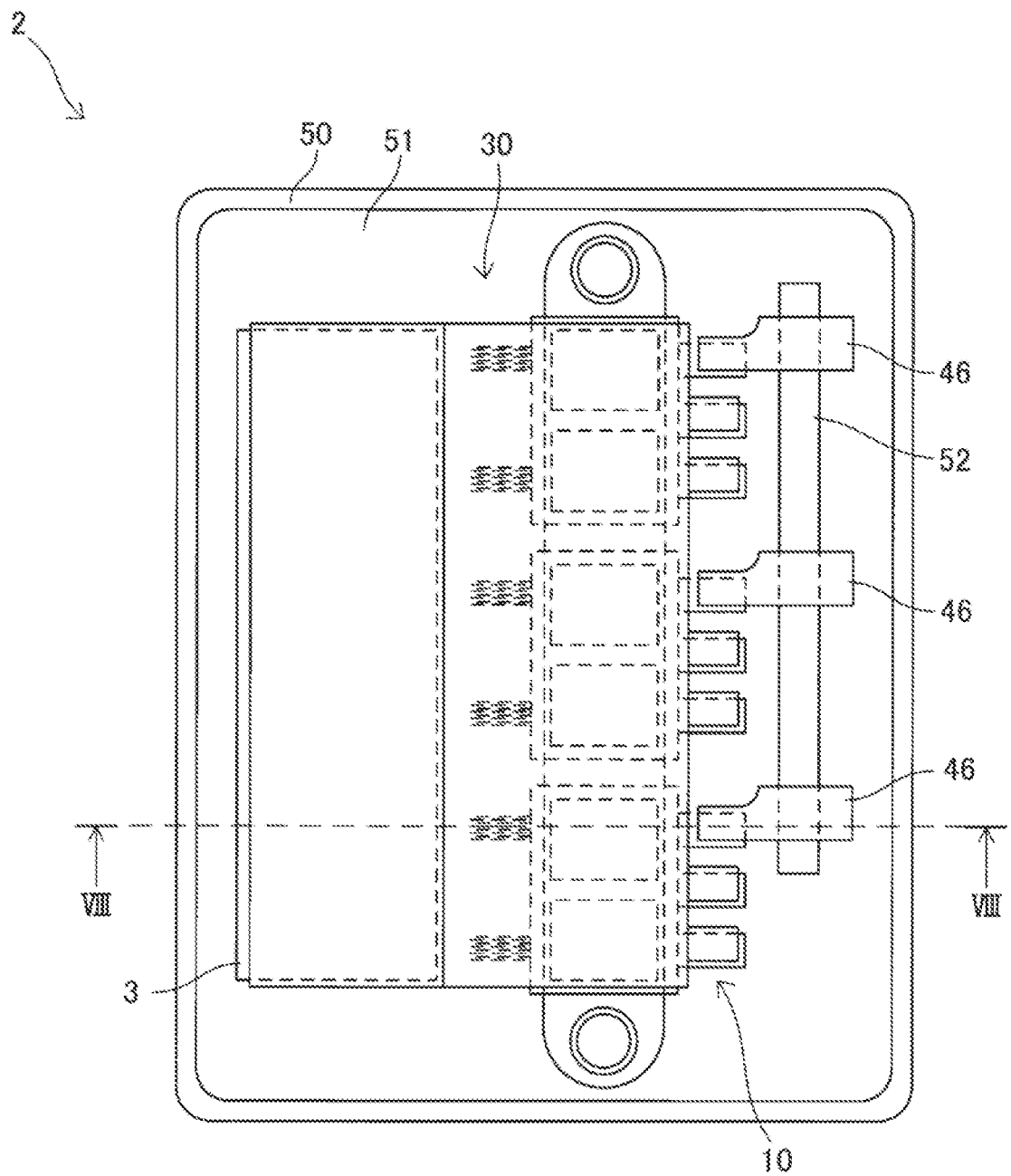
FIG. 7 is a plan view of the electric power converter in the first embodiment.
Figure 7:
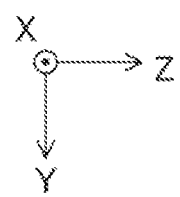

FIG. 7 is a plan view of the electric power converter 2. In FIG. 7, the components of the capacitor 3 and assembly 30 hidden behind the positive bus bar 41 and the negative bus bar 43 are shown by broken lines. The assembly 30 described above is accommodated in a case 50. The assembly 30 is fixed to a bottom plate 51 of the case 50. Although described in detail later, the bottom plate 51 has a projection 52 and the three output bus bars 46 are thermally in contact with the projection 52.

Figure 8:
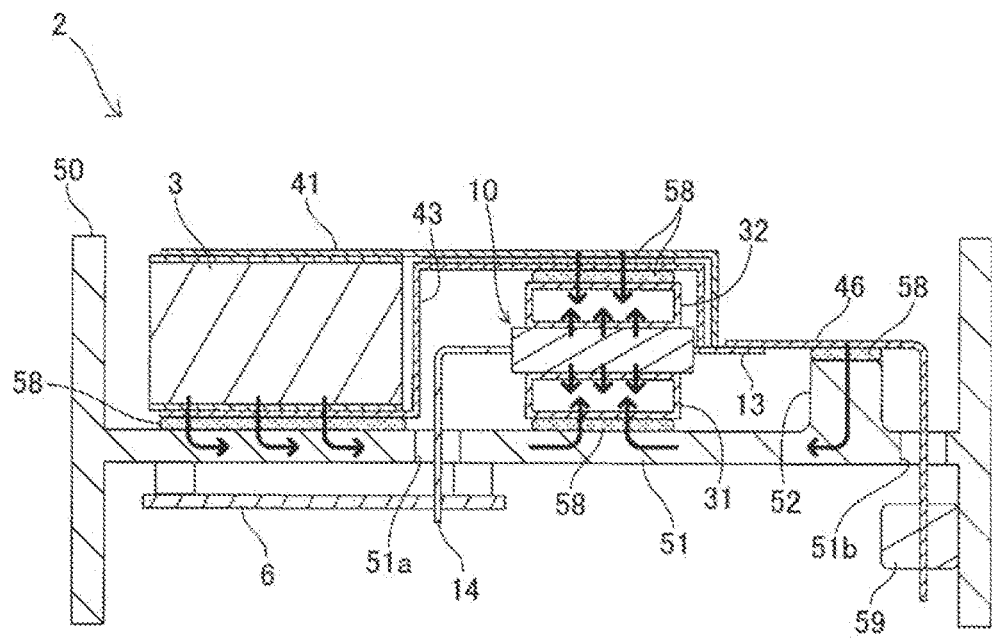
FIG. 8 is a cross-sectional view of the electric power converter taken along line VIII-VII of FIG. 7.

FIG. 8 is a cross-sectional view taken along line VIII-VIII of FIG. 7. FIG. 8 illustrates the transverse section of the power module 10, but illustration of the internal structure of the power module 10 is omitted. The internal structure of the power module 10 is as described above with reference to FIGS. 3 and 4.

For the convenience of description, the +X direction in the coordinate system illustrated in FIG. 8 is defined as "upward direction". That is, the upper surface of the first cooler 31 and the lower surface of the second cooler 32 are in contact with the power module 10. An insulating sheet having high thermal conductivity is inserted between the coolers 31, 32 and the power module 10, but illustration of the insulating sheet is omitted.

The coolers 31, 32 and the power module 10 are stacked in the X direction in the coordinate system illustrated in FIG. 8. The upper surface of the first cooler 31 is in contact with the power module 10, and the lower surface of the first cooler 31 is in contact with the bottom plate 51 of the case 50 with an insulating sheet 58 in between. Herein, a state in which two components are thermally in contact with each other with the highly thermal-conductive insulating sheet 58 in between will be simply described as "the two components are in contact with each other". The thermal conductivity of the insulating sheet 58 is higher than the thermal conductivity of the case 50.

The bottom plate 51 has the projection 52, and a vertex surface of the projection 52 is (thermally) in contact with the output bus bars 46 with the insulating sheet 58 in between. The projection 52 is positioned next to the first cooler 31. The output bus bars 46 are bent downward at a right angle, and their leading ends pass through a through-hole 51b of the bottom plate 51 and further pass through a current sensor 59.

The control terminals 14 of the power modules 10 pass through the bottom plate 51a of the bottom plate 51 and are connected to the motor controller 6 under the bottom plate 51. The motor controller 6 is implemented by a logical circuit mounted on a circuit board.

The negative bus bar 43 connected to the negative terminals 12 of the power modules 10 is in contact with the upper surface of the second cooler 32 with the insulating sheet 58 in between. The negative bus bar 43 is further in contact with the bottom plate 51 of the case 50 with the insulating sheet 58 in between. The negative bus bar 43 is sandwiched between the capacitor 3 and the bottom plate 51.

The positive bus bar 41 connected to the positive terminal 11 of the power module 10 faces the negative bus bar 43 with the insulating sheet 58 in between at a position facing the second cooler 32.

The case 50 is made of a metal having high thermal conductivity. The case 50 is typically made of aluminum.

The power modules 10 (the switching elements 4a and 4b) generate a large amount of heat. The structure illustrated in FIG. 8 effectively cools the switching elements 4a and 4b. Features of the structure will be listed below.

The thick arrowed lines in FIG. 8 schematically represent flows of heat. A part of heat from the power modules 10 is absorbed by the coolers 31 and 32 on both surfaces. The part of the heat is absorbed through the upper surface of the first cooler 31. Another part of the heat flows to the midpoint terminals 13 and the output bus bars 46. The output bus bars 46 are next to the first cooler 31 and are in contact with the projection 52 of the bottom plate 51. The lower surface of the first cooler 31 is in contact with the bottom plate 51 with the insulating sheet 58 in between. The heat having flown to the output bus bars 46 is absorbed by the lower surface of the first cooler 31 through the bottom plate 51 including the projection 52. That is, the first cooler 31 cools the power modules 10 by its both surfaces.

The heat from the power modules 10 is also absorbed through the lower surface of the second cooler 32. Another part of the heat from the power modules 10 flows to the negative terminals 12 and the negative bus bar 43. The negative bus bar 43 are in contact with the upper surface of the second cooler 32 with the insulating sheet 58 in between. The part of the heat from the power modules 10 is absorbed by the upper surface of the second cooler 32 through the negative terminals 12 and the negative bus bar 43. That is, the second cooler 32 also cools the power modules 10 using both of its surfaces.

The negative bus bar 43 is in contact with the upper surface of the second cooler 32 and is also in contact with the bottom plate 51 of the case 50 with the insulating sheet 58 in between. Further, the negative bus bar 43 is sandwiched between the capacitor 3 and the bottom plate 51. The heat from the negative bus bar 43 is absorbed by the lower surface of the first cooler 31 through the bottom plate 51. The heat from the capacitor 3 is also transferred to the negative bus bar 43, and thus a part of the heat from the capacitor 3 is absorbed by the lower surface of the first cooler 31 via the negative bus bar 43 and the bottom plate 51.

As described above, in the electric power converter 2, the pair of the coolers 31 and 32 sandwich the plurality of power modules 10. Each of the coolers 31 and 32 can cool the power modules 10 (the switching elements 4a and 4b) by effectively using its both surfaces.

The features of the electric power converter 2 can be described in another way as below. The electric power converter 2 includes the pair of coolers 31 and 32 that sandwich the power modules 10. The stacked body of the power module 10 and the coolers 31 and 32 is accommodated in the case 50. The surface (lower surface) of the first cooler 31 opposite to the power modules 10 is in contact with the case 50, the output bus bars 46 connected to the midpoint terminal 13 are in contact with the case 50 next to the first cooler 31. Since the output bus bars 46 are in contact with the case 50 next to the first cooler 31, the heat transferred from the power modules 10 to the case 50 through the output bus bars 46 is significantly absorbed by the first cooler 31. The first cooler 31 directly cools the power modules 10 by one surface (upper surface) and absorbs the heat transferred from the power modules 10 via the midpoint terminals 13 and the output bus bars 46 by the other surface (lower surface).

Other features of the structure of the electric power converter 2 illustrated in FIGS. 7 and 8 will be described below. The coolers 31 and 32 sandwich the plurality of power modules 10 in the X direction in the coordinate system illustrated in the drawings. The plurality of power modules 10 is arranged in the Y direction such that each of them is in contact with the coolers 31 and 32. The power modules 10 are flat and their wide surfaces are in contact with the coolers 31 and 32. The coolers 31 and 32 are also flat and their wide surfaces are in contact with the power modules.

The power terminals (the positive terminal 11, the negative terminal 12, and the midpoint terminal 13) of each of the power modules 10 extend in the Z direction from the narrow surface of the power module 10 oriented in the Z direction. The capacitor 3 is aligned with the coolers 31 and 32 and the power modules 10 in the Z direction. The capacitor 3 is aligned with the power modules 10 on the side opposite to the power terminals.

The power terminals (the positive terminal 11, the negative terminal 12, and the midpoint terminal 13) are each metal plates in which the surface oriented in the X direction is wider than the surface oriented in the Y direction and the surface oriented in the Z direction. That is, in the electric power converter 2, the coolers 31 and 32, the power module 10, and the power terminals are all flat and are arranged such that their wide surfaces are oriented in the same direction (X direction). The electric power converter 2 constitutes an inverter using only the three power modules 10 sandwiched between the pair of coolers 31 and 32. The large-sized capacitor 3 is arranged next to the stacked body of the pair of coolers 31 and 32 and the power module 10 as seen in the Z direction. The above-described arrangement allows the electric power converter 2 to be shortened in the X direction.

The electric power converter 2 in the first embodiment constitutes an inverter by the three flat power modules 10 sandwiched between the pair of flat coolers 31 and 32. As apparent in FIGS. 7 and 8, the electric power converter 2 in the embodiment has an entirely flat and simple structure.

Second Embodiment

Figure 9:
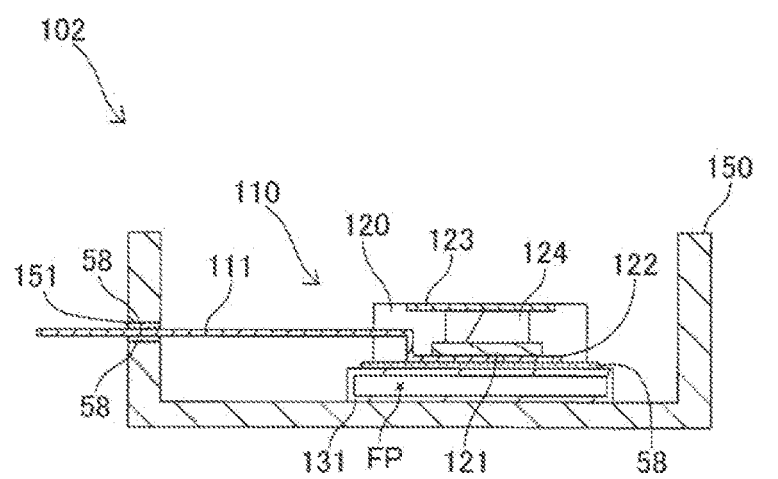
FIG. 9 is a cross-sectional view of an electric power converter in a second embodiment.

FIG. 9 is a cross-sectional view of an electric power converter 102 in a second embodiment. In FIG. 9, for the sake of description, a +X direction is defined as "upward direction", and a −X direction is defined as "downward direction". The electric power converter 102 includes a power module 110 and a cooler 131 that are accommodated in a case 150. The power module 110 is a device in which a semiconductor chip 121 is embedded in a resin package 120. A switching element for electric power conversion is packaged on the semiconductor chip 121.

Electrodes are exposed on upper and lower surfaces of the semiconductor chip 121. The positive electrode is exposed on the lower surface of the semiconductor chip 121, and is joined to a metal plate 122. The negative electrode is exposed on the upper surface of the semiconductor chip 121 and is joined to a copper block 124. A metal plate 123 is joined to the negative terminal 124 on the side opposite to the semiconductor chip 121. First surfaces of the metal plates 122 and 123 are exposed on the package 120 and contribute to heat dissipation from the semiconductor chip 121 (switching element).

A positive terminal 111 is coupled to the edge of the metal plate 122. The positive terminal 111 extends toward the outside of the package 120. The positive terminal 111 extends toward the outside of the case 150 through a through hole 151 in the case 150. The positive terminal 111 and the case 150 face each together with a highly thermal-conductive insulting sheet 158 in between. The thermal conductivity of the insulting sheet 158 is higher than the thermal conductivity of the case 150. The positive terminal 111 and the case 150 are thermally in contact with each other with the insulting sheet 158 in between.

The lower side of the package 120 of the positive terminal 110 faces the upper surface of the cooler 131 with the insulating sheet 58 in between. The package 120 is thermally in contact with the cooler 131 with the highly thermal-conductive insulating sheet 58 in between. The thermal conductivity of the insulating sheet 58 is higher than the thermal conductivity of the case 150. The lower surface of the cooler 131 is in contact with the case 150. The cooler 131 internally has a flow path FP through which a liquid refrigerant passes.

A part of the heat from the semiconductor chip 121 (switching element) is absorbed by the upper surface of the cooler 131 via the insulating sheet 58. Another part of the heat from the semiconductor chip 121 (switching element) is absorbed by the lower surface of the cooler 131 via the positive terminal 111, the insulting sheet 158, and the case 150. As such, the cooler 131 absorbs the heat from the semiconductor chip 121 (switching element) through its both surfaces.

The midpoint terminals 13 and the positive terminals 111 in the embodiment correspond to one example of a first terminal. The output bus bars 46 correspond to an example of a first bus bar. The negative terminals 12 and the negative bus bar 43 correspond to examples of a second terminal and a second bus bar, respectively. The positive terminals 11 and the positive bus bar 41 correspond to examples of a third terminal and a third bus bar, respectively. The upper surface of the first cooler 31 corresponds to a first surface, and the lower surface of the same corresponds to a second surface. The lower surface of the second cooler 32 corresponds to the first surface, and the upper surface of the same corresponds to the second surface. The upper surface of the cooler 131 corresponds to the first surface, and the lower surface of the same corresponds to the second surface.

As described above, the expression "the power module and the cooler are in contact with each other" herein includes a state in which the power module and the cooler sandwich a highly thermal-conductive insulating sheet and they are thermally in contact with each other.

In the electric power converters of the embodiments, the power module is in contact with the first surface of the cooler, and the case is in contact with another surface of the cooler opposite to the first surface. The case is in contact with the surface of the cooler different from the first surface. For example, the power module may be in contact with the upper surface of the cooler and the case may be in contact with a side surface of the cooler. The power module may be in contact with the first surface of the cooler, and another power module may be in contact with another surface of the cooler opposite to the first surface Specific examples of the present invention have been described above in detail, but they are merely exemplifications and are not intended to limit the claims. The technique described in the claims also includes various modifications and alterations of the specific examples exemplified above. The technical elements described in this specification or the drawings have technical utility singly or in various combinations thereof, and are not limited to the combinations described in the claims as of the patent application. In addition, the technique exemplified in this specification or the drawings can attain a plurality of objectives at the same time, and attaining one of the objectives has technical utility by its own.

What is claimed is:

1. An electric power converter comprising:
   a power module including a package accommodating a switching element for electric power conversion and a first terminal, a second terminal, and a third terminal connected to the switching element in the package and extending to outside of the package;
   a first cooler in contact with the power module;
   a case accommodating the power module and the first cooler; and
   a second cooler and a capacitor accommodated in the case, wherein
   the power module is sandwiched between the first cooler and the second cooler,
   a first surface of the first cooler is in contact with the power module, and a second surface of the first cooler different from the first surface is in contact with the case,
   the first terminal or a first bus bar connected to the first terminal is in contact with the case,
   a second bus bar connected to the second terminal and a third bus bar connected to the third terminal are each connected to the capacitor,
   a first surface of the second cooler is in contact with the power module, and
   the second terminal or the second bus bar is in contact with a second surface of the second cooler different from the first surface.

2. The electric power converter according to claim 1, wherein
   the second terminal or the second bus bar is in contact with the case.

3. The power module according to claim 2, wherein
   the second bus bar is sandwiched between the case and the capacitor.

4. The electric power converter according to claim 1, wherein
   the first cooler and the second cooler sandwich a plurality of the power modules in a first direction,
   the plurality of power modules is arranged in a second direction crossing the first direction, and the first terminal of each of the power modules is a metal plate that extends along a third direction crossing both the first direction and the second direction, and has a surface oriented in the first direction that is wider than a surface oriented in the second direction and a surface oriented in the third direction.

5. The electric power converter according to claim 1, wherein
the capacitor is aligned with the first cooler in a direction parallel to the direction in which the first terminal extends.

6. The electric power converter according to claim 1, wherein
the first surface and the second surface of the second cooler are parallel to each other.

7. The electric power converter according to claim 1, wherein
the first surface and the second surface of the first cooler are parallel to each other.

8. The electric power converter according to claim 1, wherein
the first terminal or the first bus bar is in contact with the case next to the first cooler.

\* \* \* \* \*